(12) United States Patent
Rodal et al.

(10) Patent No.: US 7,936,850 B2
(45) Date of Patent: May 3, 2011

(54) METHOD AND APPARATUS FOR PROVIDING A DIGITAL AUTOMATIC GAIN CONTROL (AGC)

(75) Inventors: Eric B. Rodal, Gardenville, NV (US); Charles Abraham, Los Gatos, CA (US)

(73) Assignee: Broadcom Corporation, Irvine, CA (US)

( * ) Notice: Subject to any disclaimer, the term of this patent is extended or adjusted under 35 U.S.C. 154(b) by 1056 days.

(21) Appl. No.: 11/654,379

(22) Filed: Jan. 17, 2007

(65) Prior Publication Data

US 2008/0170606 A1 Jul. 17, 2008

(51) Int. Cl.
*H04L 27/08* (2006.01)
(52) U.S. Cl. ........................................ 375/345
(58) Field of Classification Search .............. 375/259, 375/279, 280, 316, 324, 326, 329, 331, 345, 375/354; 455/108, 127.1, 118, 245.1, 340.1, 455/234.1, 234.2, 232.1, 69, 239.1, 241.1, 455/242.1, 244.1, 249.2, 247.1, 280.1; 379/387.02; 324/607; 341/126, 127, 128, 155, 156, 159
See application file for complete search history.

(56) References Cited

U.S. PATENT DOCUMENTS

| | | | |
|---|---|---|---|
| 5,083,304 A * | 1/1992 | Cahill | 375/345 |
| 2003/0145328 A1* | 7/2003 | Rabinowitz et al. | 725/72 |
| 2003/0227986 A1* | 12/2003 | Filipovic | 375/345 |

* cited by examiner

*Primary Examiner* — Sam K Ahn
(74) *Attorney, Agent, or Firm* — McAndrews, Held & Malloy, Ltd.

(57) ABSTRACT

A method and apparatus for providing a digital automatic gain control (AGC) for a radio-frequency (RF) receiver. The receiver comprises a logarithmic analog-to-digital converter for sampling the analog RF signals, a FIR filter for filtering the digitized signals, a resampler for resampling the digitized signals, and an automatic gain control circuit. The AGC circuit controls the resampling process to provide automatic gain control function in the digital domain. The resampler circuit has as its input a digital signal having a first plurality of bits. The output signal from the resampler has a second plurality of bits, where the second plurality of bits are less than the first plurality of bits. The automatic gain control circuit controls the resampling of the first plurality of bits to form the second plurality of bits in accordance with an automatic gain control signal.

15 Claims, 3 Drawing Sheets

METHOD AND APPARATUS FOR PROVIDING A DIGITAL AUTOMATIC GAIN CONTROL (AGC)

BACKGROUND OF THE INVENTION

1. Field of the Invention

The present invention relates to radio frequency (RF) telecommunications and, more particularly, to a method and apparatus for providing a digital AGC in a radio-frequency (RF) receiver.

2. Description of the Related Art

Increasing market penetration of wireless communications or simply, wireless devices, such as cellular telephones, radios, global navigation satellite systems (GNSS) receivers/transceivers, and the like, is generally premised on reducing costs associated with deployment of such devices while maintaining or improving performance and/or adding features thereto. One way to accomplish this task is to continually improve upon the devices' components that perform electronic functions for wireless communications. For example, through continuous improvement of such components, newer generations of such wireless devices are routinely deployed in smaller packages with more processing power and lower power consumption, yet cost less than their earlier counterparts.

One way to lower cost and improve performance is to use digital circuitry in substantially all of the subcomponents of a receiver. Digital circuits can be formed on a single substrate or a small number of substrates within an integrated circuit package that allow for improved power consumption as well as processing power. Such receivers are capable of receiving signals at very low signal strengths as well as providing digital signal processing in a single receiver integrated circuit. Although most components within a digital receiver are digital in nature, certain components operate in the analog domain. Such components include, for example, a low-noise amplifier to amplify RF signals, a mixer circuit to downconvert the RF signals, and automatic gain control circuit to control the dynamic range of the receiver. To improve receiver performance, it is desirable to utilize a digital circuit in as many subcomponents of a receiver as possible.

Therefore, there is a need in the art for a method and apparatus for providing a digital automatic gain control within an RF receiver.

SUMMARY OF THE INVENTION

The invention is embodied in a method and apparatus for providing a digital automatic gain control (AGC) for a radio-frequency (RF) receiver. The receiver comprises a logarithmic analog-to-digital converter for sampling the analog RF signals, a FIR filter for filtering the digitized signals, a resampler for resampling the digitized signals, and an automatic gain control circuit. The AGC circuit controls the resampling process to provide automatic gain control function in the digital domain. The resampler circuit has as its input a digital signal having a first plurality of bits. The output signal from the resampler has a second plurality of bits, where the second plurality of bits are less than the first plurality of bits. The automatic gain control circuit controls the resampling of the first plurality of bits to form the second plurality of bits in accordance with an automatic gain control signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
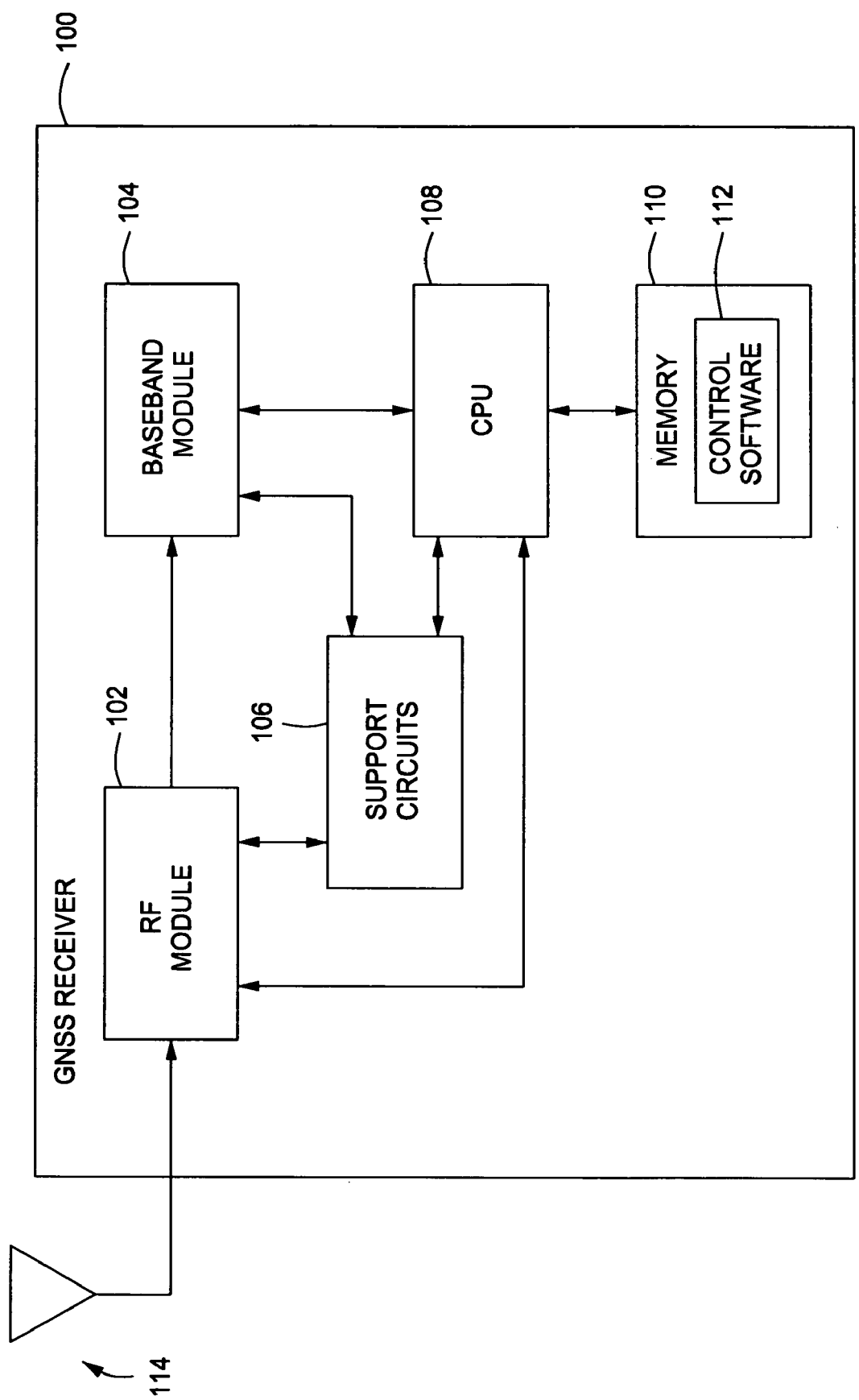
FIG. 1 is a block diagram of an illustrative embodiment of a global navigation satellite system (GNSS) receiver that utilizes the present invention.

FIG. 1 depicts a block diagram of an exemplary GNSS receiver 100 that benefits from utilizing the present invention. The receiver 100 comprises an RF module 102, a baseband module 104, support circuits 106, a central processing unit (CPU) 108, and memory 110. The receiver 100 is typically coupled to an RF antenna 114 that is tuned to receive signals from at least one GNSS satellite. The RF module 102 processes the received RF signals to produce a baseband signal. The baseband signal is coupled to the baseband module 104 where the signals are further processed to extract information used to compute the position of the GNSS receiver 100. The RF module 102 and the baseband module 104 are supported by support circuits 106 including oscillators, power supplies, clock circuits, and the like. The CPU 108 performs control and computation functions by executing control software 112 that is stored in memory 110.

The GNSS receiver 100 may be implemented as a standalone receiver or as a component within a system or device. In one embodiment, the receiver 100 may be a component within a cellular telephone. In such an arrangement, the CPU 108, memory 110, and some support circuits 106 may form a portion of the cellular telephone. This configuration is known as a host-based configuration.

The use of the invention within a GNSS receiver 100 is only one specific embodiment of the invention. The digital AGC of the present invention may find use in any digital RF receiver.

Figure 2:
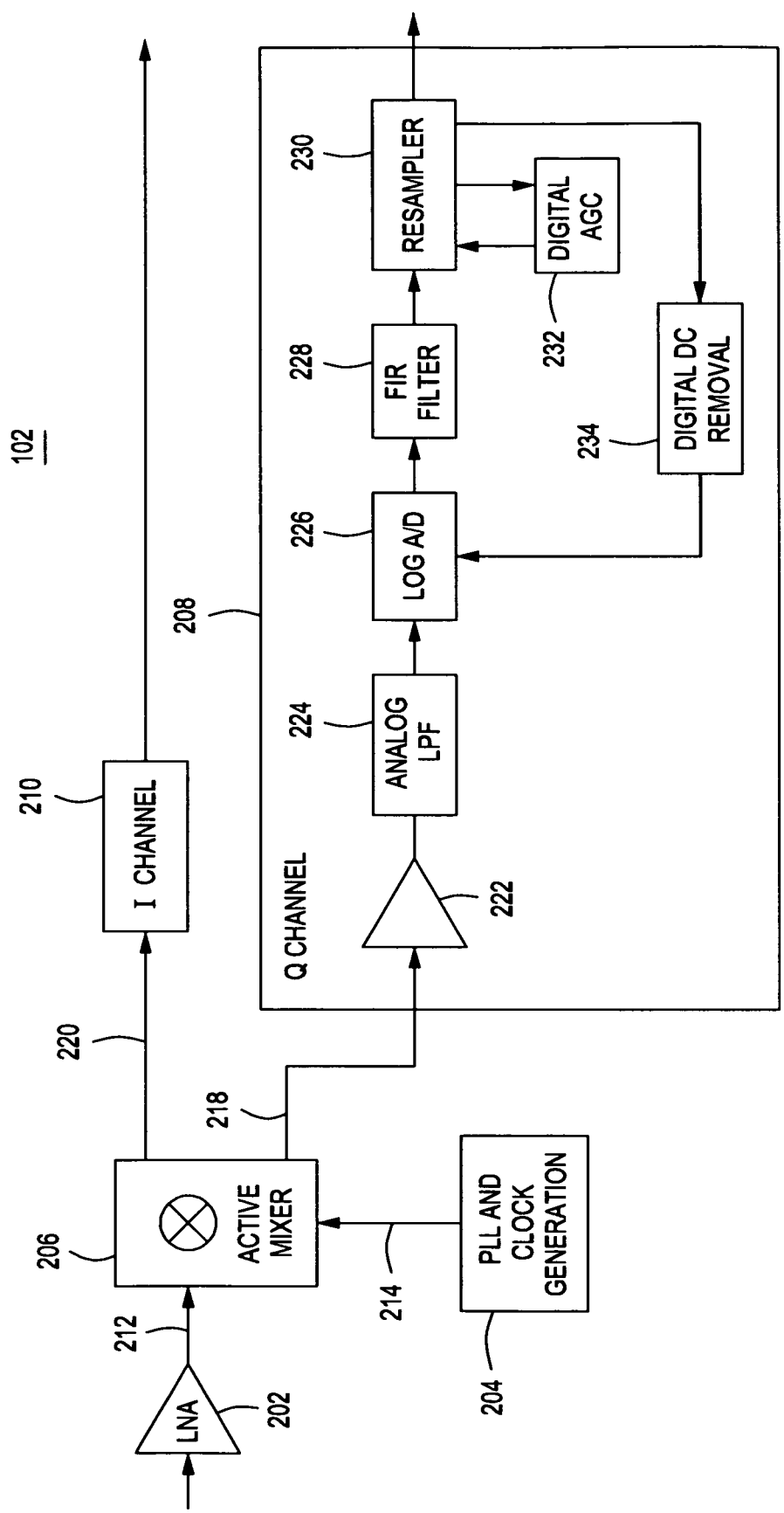
FIG. 2 is a block diagram illustrating an embodiment of a radio frequency (RF) module of a receiver used in the GNSS system of FIG. 1.

FIG. 2 is a block diagram illustrating an example of the RF module 102 of the receiver 100. The RF module 102 includes a low-noise amplifier 202 (LNA) and a phase lock loop (PLL) and clock generator 204 coupled to a mixer 206, which in turn, is communicatively coupled to first and second processing channels 208 and 210.

The LNA 202 includes an input and an output, and functions to amplify and filter the RF signal so as to minimize noise generated during amplification of the RF signal. The input is adapted to receive an RF signal from the antenna 114 of FIG. 1. The output of the LNA 202 is adapted to provide the amplified RF signal to the mixer 206. The PLL and clock generator 204 includes circuitry that is adapted to generate a local oscillator signal for the mixer 206. The circuitry may comprise a local oscillator, a phase lock loop, or other closed loop feedback control system, a clock signal, or any other device capable of providing the local oscillator signal.

Each of the first and second processing channels 208 and 210 are configured to respectively process the first and second output signals (i.e., I and Q signals from the mixer 206) into respective first and second baseband signals. The processing channels 208 and 210 comprise an amplifier 222, a low-pass filter 224, an analog-to-digital converter 226, a digital filter 228, a resampler 230, an automatic gain control circuit 232, and a DC removal device 234. Since both channels comprise identical components, for brevity sake, only the first processing channel 208 is described herein.

The amplifier 222 is adapted to receive and amplify the first output signal and provide it to the low-pass filter 224. The low-pass filter 224 may be, for example, an analog low-pass filter. The low-pass filter 224 is adapted to filter the first output signal in preparation of passing the signal to the A/D converter 226. The low-pass filter 224 provides band limiting and removes out-of-band interference. In one embodiment, the low-pass filter 224 has about a 10 MHz bandwidth. The A/D converter 226, depending on the filtering by the low-pass filter 224, may be a logarithmic-type analog-to-digital converter or any other type of analog-to-digital converter. Using a logarithmic-type A/D extends the dynamic range of the signal processing. The A/D converter 226 functions to convert the first output signal into a digital waveform representative of the first output signal. Similarly, the A/D converter not shown within the other processing channel, functions to convert the second output signal into a digital waveform representative of the second output signal. In the embodiment using a log A/D, the input signal comprises 15 levels (e.g., 7-bit) with the A/D conversion thresholds spaced logarithmically. The output comprises 9-bits.

The digital filter 228 is adapted to receive and filter the digital signal to provide band limiting and remove unwanted aberrations in the first digital signal, which can be caused by the A/D 226 as a result of sampling the first output signal. The digital filter 228 may be embodied as a finite impulse response (FIR) filter. In one embodiment used to receive GNSS signals, the filter 228 has a 4 MHz bandwidth. This embodiment uses a 22-top FIR filter that produces a 15-bit output signal. Such a large number of bits permits the AGC to operate with fine granularity.

The resampler 230 operates in conjunction with the digital AGC 232 to provide gain control in the digital domain. The function and operation of the resampler 230 and the digital AGC 232 shall be discussed in detail below with respect to FIG. 3.

The DC removal device 234, in turn, functions to remove any direct current component of the first digital signal to simplify and, thus, aid in further processing of the first digital signal by the receiver. The DC removal device 234 may be any device capable of removing the direct current component of the first digital signal.

Figure 3:
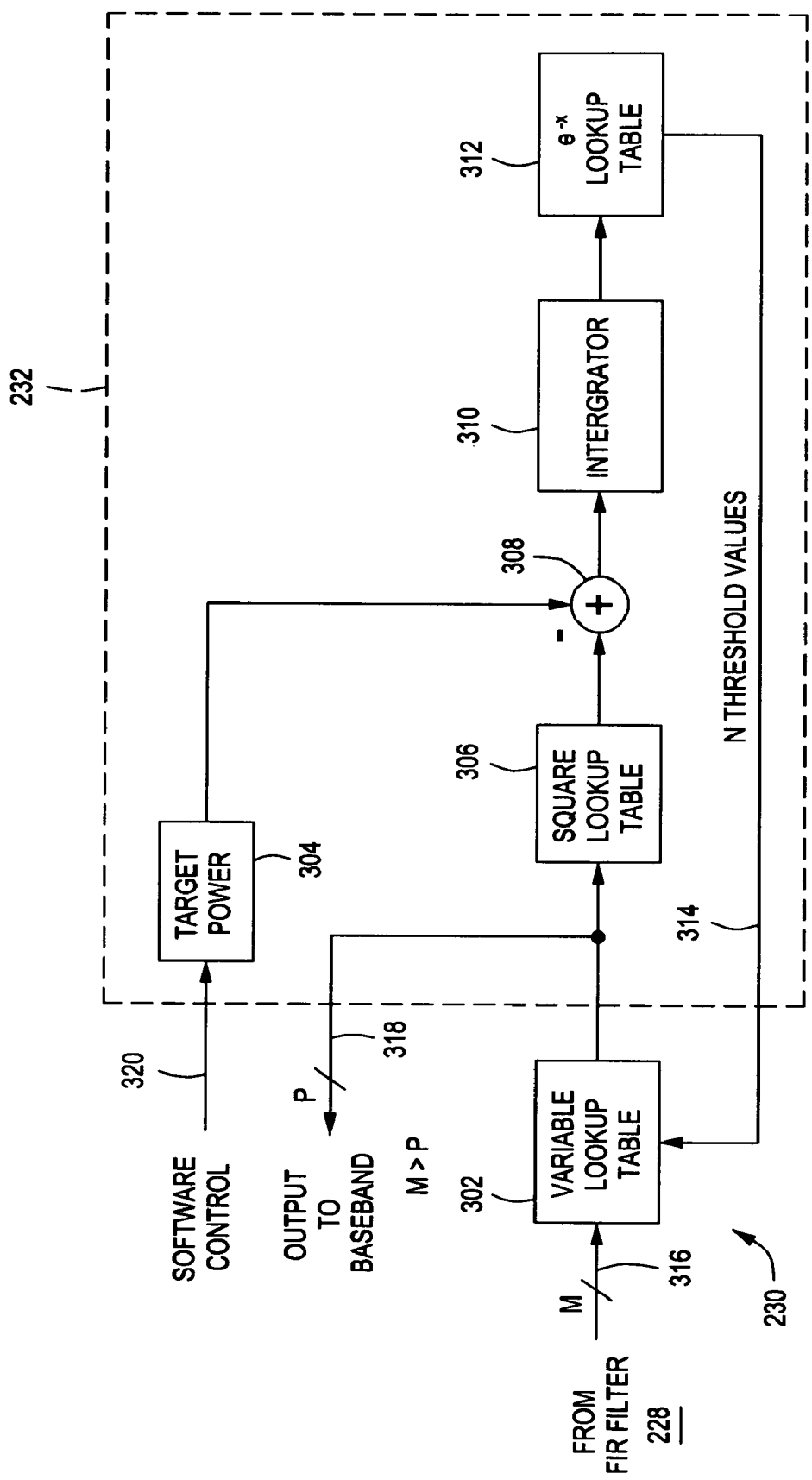
FIG. 3 is a block diagram of an automatic gain control circuit in accordance with the present invention.

FIG. 3 depicts one embodiment of the resampler 230 and the digital AGC circuit 232. In this embodiment, the resampler 230 is embodied in a variable lookup table 302. The variable lookup table has as its input the output of the FIR filter 228. This is an extremely wide dynamic range signal having a large number of bits (M bits). The output of the lookup table is a smaller number of bits (P bits). The variable lookup table 302 maps the first plurality of bits (M bits) to the second plurality of bits (P bits), where M is greater than P. In one embodiment of the invention, M is 17 and P is 5. In this manner, the resampler 230 ensures that the signal to the baseband module 104 has an appropriate signal strength and dynamic range to facilitate baseband processing.

The control signal on line 314 is generated by the AGC circuit 232. The AGC signal comprises N threshold values, where N is any integer value. For example, N in one embodiment equals eight, to provide eight threshold values that control the mapping of signals in the resampler 230. The dynamic range of the input signal to the resampler is divided into N+1 segments. Within each segment range, the resampler 230 maps the signal strength into a value having the second plurality of bits, e.g., a P bit value.

To create the AGC signal, the second plurality of bits (i.e., the output of the variable lookup table) is squared in block 306, then applied to a differencing circuit 308 (subtractor). The circuit 308 has a second input, a control level for a target output power level of the signal that will be delivered to the baseband module. This target power level is under software control via path 320, which sets a target power level at block 304 that is applied to the differencing circuit 308. The target level of power and the power that is actually created at the output on line 318 are subtracted to create a difference signal. The difference signal is then integrated in integrator 310. The output of the integrator is applied to another lookup table; this lookup table is an antilog lookup table 312. The antilog lookup table 312 compensates for the squaring function of block 306 such that, the logarithmic value of the output power is linearized to form the N threshold values. The antilog lookup table maps the integrated digital value into one of the N threshold levels. By using an antilog function in the AGC loop, the AGC bandwidth is relatively constant over a wide range of input amplitudes.

The output of the antilog lookup table 312 is one of N threshold values, a digital number on path 314. These N levels control the lookup function of the variable lookup table 302 to map the M-bit input to the P-bit output. In this manner, the M-bit dynamic range of the signal from the FIR filter is mapped to a P-bit signal that can be easily handled and processed by the baseband module 104 in a known manner.

In this manner, a circuit that is typically an analog circuit, the automatic gain control function, is provided in a digital form within the RF module of an RF receiver. The utilization of such a digital circuit in lieu of an analog circuit improves the signal processing quality, lowers the cost, and improves the power consumption of the RF receiver.

The use of the digital AGC circuit is especially useful in a GNSS receiver where the signal levels are at best equal to the noise level and, in most instances, are well below the noise level. The digital AGC circuit adapts to changes in the gain of the receiver, rather than changes in signal level. To operate properly, AGC circuits rely on the signal level being greater than the noise level. When receiving GNSS signal, such a requirement cannot be met. The present invention is well adapted for performance in the low signal level environment of a GNSS receiver. Nonetheless, prior art terrestrial signal receivers also benefit from the superior performance of the digital AGC circuit of the present invention.

While the foregoing is directed to embodiments of the present invention, other and further embodiments of the invention may be devised without departing from the basic scope thereof, and the scope thereof is determined by the claims that follow.

The invention claimed is:

1. A radio frequency (RF) receiver comprising:
    an amplifier for amplifying an RF signal;
    a mixer circuit for converting the amplified RF signal to an in-phase intermediate frequency (IF) signal and a quadrature IF signal;
    an in-phase IF signal processing channel comprising a logarithmic analog to digital (A/D) converter to convert the in phase IF signal to a in-phase digital signal and an in-phase digital automatic gain control (AGC) for controlling an amplitude of the in-phase digital signal;
    a quadrature-phase IF signal processing channel comprising a logarithmic analog to digital (A/D) converter to convert the quadrature phase signal to a quadrature-phase digital signal and a quadrature-phase digital AGC for controlling an amplitude of the quadrature-phase digital signal;

a baseband module for extracting information form the amplitude controlled in-phase digital signal and the amplitude controlled quadrature phase digital signal.

2. The RF receiver of claim 1 wherein the in-phase and quadrature-phase digital AGC circuits comprise:
a resampler;
a digital AGC circuit, coupled to the resampler, for controlling mapping of a first digital signal to a second digital signal, where the first digital signal comprises more bits than the second digital signal.

3. The RF receiver of claim 2 wherein the first digital signal comprises 17 bits and the second digital signal comprises 5 bits.

4. The RF receiver of claim 2 wherein the resampler is a variable look-up table.

5. The RF receiver of claim 4 wherein the variable look-up table maps the first digital signal to the second digital signal in response to an AGC control signal produced by the digital AGC circuit.

6. The RF receiver of claim 2 wherein the digital AGC circuit comprises:
a squaring circuit for squaring the second digital signal;
a subtractor, coupled to the squaring circuit, for subtracting a target power level from a squared second digital signal to produce a difference signal;
an integrator, coupled to the subtractor, for integrating the difference signal; and
an antilog lookup table to map an integrated difference signal into an N-level threshold value that forms the AGC control signal.

7. The RF receiver of claim 6 wherein the target power level is a digital signal.

8. The RF receiver of claim 2 wherein the RF signal is received from a Global Navigation Satellite System (GNSS) satellite.

9. A method for digitally controlling the gain of a circuit comprising:
mapping a first digital signal having a first number of bits, M, to a second digital signal having a second number of bits, P, where M is larger than P, in response to a gain control signal;
digitally processing the second digital signal to generate the gain control signal, wherein digital processing further comprises:
providing the gain control signal using an antilog circuit.

10. The method of claim 9 wherein the digital processing step further comprises:
squaring the second digital signal;
subtracting the squared second digital signal from a target power level to produce a difference signal;
integrating the difference signal to produce an integrated difference signal; and
mapping the integrated difference signal into the gain control signal.

11. The method of claim 9 wherein M is 17 and P is 5.

12. The method of claim 9 wherein the gain control signal comprises a certain number of levels.

13. The method of claim 9 wherein N is 8.

14. The method of claim 9 wherein the mapping step is performed by a variable lookup table.

15. The method of claim 9 wherein the circuit is a portion of a Global Navigation Satellite System (GNSS) receiver.

* * * * *